US006806622B1

(12) United States Patent
Schmidt et al.

(10) Patent No.: US 6,806,622 B1
(45) Date of Patent: Oct. 19, 2004

(54) IMPACT-REINFORCED PIEZOCOMPOSITE TRANSDUCER ARRAY

(75) Inventors: Gerald E. Schmidt, Chelmsford, MA (US); James M. Glynn, Dover, MA (US)

(73) Assignee: Materials Systems, Inc., Littleton, MA (US)

( * ) Notice: Subject to any disclaimer, the term of this patent is extended or adjusted under 35 U.S.C. 154(b) by 0 days.

(21) Appl. No.: 09/693,034

(22) Filed: Oct. 20, 2000

Related U.S. Application Data

(60) Provisional application No. 60/160,935, filed on Oct. 22, 1999.

(51) Int. Cl.[7] .......... H01L 41/04

(52) U.S. Cl. .......... 310/334; 310/369; 310/327

(58) Field of Search .......... 310/327, 334, 310/369

(56) References Cited

U.S. PATENT DOCUMENTS

| | | | | | |
|---|---|---|---|---|---|
| 4,683,396 | A | * | 7/1987 | Takeuchi et al. | 310/358 |
| 4,728,845 | A | * | 3/1988 | Haun et al. | 310/358 |
| 4,755,707 | A | * | 7/1988 | Nakaya et al. | 310/334 |
| 5,334,903 | A | * | 8/1994 | Smith | 310/358 |
| 5,376,859 | A | * | 12/1994 | Kim et al. | 310/334 |
| 5,673,236 | A | * | 9/1997 | Barger | 367/157 |
| 5,684,884 | A | * | 11/1997 | Nakaya et al. | 381/190 |
| 5,945,770 | A | * | 8/1999 | Hanafy | 310/322 |

* cited by examiner

*Primary Examiner*—Thomas M. Dougherty
(74) *Attorney, Agent, or Firm*—Pearson & Pearson, LLP

(57) ABSTRACT

An impact-reinforced piezocomposite transducer array comprises a load supporting structure having a plurality of cells, each of said cells comprises a piezocomposite transducer element. The load supporting structure comprises a honeycomb structure having a plurality of multi-sided cells or the structure comprises a plurality of cylindrical cells. The piezocomposite element includes a plurality of piezoceramic rods encapsulated in a polymeric matrix to form a 1-3 composite body. The transducer array may be used as a hydrophone or a transmitter in a rugged environment such as on the hull of an icebreaker ship.

26 Claims, 5 Drawing Sheets

IMPACT-REINFORCED PIEZOCOMPOSITE TRANSDUCER ARRAY

This is a nonprovisional patent application claiming priority of provisional patent application Ser. No. 60/160,935, filed Oct. 22, 1999.

BACKGROUND OF THE INVENTION

1. Field of the Invention

The present invention relates to piezoelectric ceramic-polymer composite transducer arrays, and particularly to acoustic transducer arrays which are suitable for rugged use.

2. Description of Related Art

One example of a rugged use for an acoustic transducer array is as a hydrophone for use as a sensor or transmitter on the hull of an icebreaker or surface-mounted on other equipment used in arctic waters.

At present, such an array, e.g., that used as a hull-mounted array on a ship fitted as an icebreaker, is mounted beneath a reinforced plastic "array window" approximately four inches thick. The array is separated from the reinforced plastic window by a layer of seawater. Thus, the plastic window serves as a part of the ice-breaking shell of the ship, and the plastic window and the water layer act as a protective lens to shield the array from impact damage from contact with ice at and below the water surface.

The plastic and water layers, however, also tend to decouple the array from the water medium, significantly deadening the sensor sensitivity and its acoustic output.

There is a long-felt need for an acoustic array for use in such extreme applications which combines the advantages of ruggedness, e.g., impact resistance, and high sensitivity, particularly at low frequencies. The invention described hereinafter meets such a need.

SUMMARY OF THE INVENTION

Accordingly, it is therefore an object of the present invention to provide an impact-resistant acoustic transducer having a honeycomb structure including a plurality of cells with each cell having a piezoelectric transducer.

It is another object of this invention to provide an impact-resistant acoustic transducer having a honeycomb structure including a plurality of cells, each of the cells having a piezoelectric transducer and each piezoelectric transducer comprises at least one piezocomposite element.

It is a further object of the present invention to provide a piezocomposite transducer array suitable for application in a rugged environment.

It is yet another object of this invention to provide an acoustic transducer array as a hydrophone for use as a sensor or transmitter on the hull of an icebreaker.

It is a further object of this invention to provide an array of piezocomposite transducer elements comprising a plurality of piezoceramic rods encapsulated in a polymeric matrix to form a piezocomposite body.

It is another object of this invention to provide a honeycomb structure having a plurality of cells, each of the cells comprising a 1-3 piezocomposite element.

It is another object of this invention to provide a honeycomb structure having a plurality of cells, each of the cells comprising a 2-2 piezocomposite element.

It is a further object of this invention to wire the piezocomposite transducer elements for sensing or for transmitting or for a combination of sensing and transmitting.

These and other objects are accomplished by an acoustic transducer comprising a honeycomb structure having a plurality of cells, each of the cells comprises a piezoelectric transducer, and each piezoelectric transducer comprises a stack having at least one piezocomposite element. Each of the plurality of cells comprises a multi-sided cell or a cylindrical cell depending on the configuration of the honeycomb structure.

The objects are further accomplished by an acoustic transducer array comprising a honeycomb structure having a plurality of cells, each of the cells comprises a piezoelectric transducer, each piezoelectric transducer comprises a stack having at least one piezocomposite element, each piezocomposite element includes a plurality of piezoceramic elements, the piezoceramic elements being arranged parallel to each other, the plurality of piezoceramic elements of the piezocomposite element being encapsulated in a polymeric matrix forming the piezocomposite element, a front planar surface and a back planar surface of the piezocomposite element comprise an electrically conductive layer, and a soft pressure release material is disposed around each stack except on a surface of the stack facing a front surface of the acoustic transducer array. The transducer array comprises means disposed adjacent to the plurality of cells for providing waterproofing of the acoustic transducer array. The honeycomb structure comprises a plurality of multi-sided cells. The honeycomb structure may also comprise a plurality of cylindrical cells. The honeycomb structure comprises a matrix of a plurality of strips attached together at cross-over points, the strips being made of an impact-resistant material. The honeycomb structure comprises a molded or drilled-out structure made of an impact-resistant material. The piezocomposite element comprises a 1-3 connectivity configuration. The piezocomposite element comprises a 2-2 connectivity configuration. Each piezocomposite element is separately wired for sensing as a single element. The piezocomposite element may be wired for sensing in a phased array configuration. Each piezocomposite element may be separately wired for transmitting as a single element. Each piezocomposite element may be separately wired for transmitting in a phased array configuration.

The stack comprises the piezocomposite element, an acoustic matching layer adjacent to a front surface of the piezocomposite element, and a stiffening layer adjacent to a back surface of the piezocomposite element. The stack may also include the piezocomposite element and a stiffening layer adjacent to a back surface of the piezocomposite element. The stack may further include the piezocomposite element and an acoustic matching layer adjacent to a front surface of the piezocomposite element. Each stack comprises wires extending from the front planar surface electrically conductive layer and from the back planar surface electrically conductive layer of the piezocomposite element for wiring the cells in a predetermined manner for operation of the acoustic transducer as a sensor array. Each stack comprises wires extending from the front planar surface electrically conductive layer and from the back planar surface electrically conductive layer of the piezocomposite element for wiring the cells in a predetermined manner for operation of the acoustic transducer as a transmitter array. Also, the stack may comprise a first piezocomposite element disposed adjacent to a second piezocomposite element, an acoustic matching layer adjacent to a front surface of the first piezocomposite element, and a stiffening layer adjacent to a back surface of the second piezocomposite element. In addition, the stack comprises a piezocomposite element, a first acoustic matching layer positioned adjacent to a front surface of the piezocomposite element, a second acoustic matching layer positioned adjacent to the first acoustic matching layer, and a stiffening layer adjacent to a back surface of the piezocomposite element.

The objects are further accomplished by the method of providing an acoustic transducer for operation in a rugged environment comprising the step of providing an impact-resistant honeycomb structure having a plurality of cells, each of the cells comprising a piezoelectric transducer.

The objects are further accomplished by the method of providing an acoustic transducer for operation in a rugged environment comprising the steps of providing an impact-resistant honeycomb structure having a plurality of cells, each of the cells comprises a piezoelectric transducer, and providing a stack in each piezoelectric transducer having at least one piezocomposite element.

The objects are further accomplished by a method of providing an acoustic transducer array for operation in a rugged environment comprising the steps of providing a honeycomb structure having a plurality of cells, each of the cells comprises a piezoelectric element, providing in each piezoelectric transducer a stack having at least one piezocomposite element, including a plurality of piezoceramic elements in each piezocomposite element, the piezoceramic elements being arranged parallel to each other, forming the piezocomposite element by encapsulating the plurality of piezoceramic elements of the piezocomposite element in a polymeric matrix, providing an electrically conductive layer on a front planar surface and a back planar surface of the piezocomposite element, and disposing a soft pressure release material around each stack except on a surface of the stack facing a front surface of the acoustic transducer array. The method comprises the step of providing means disposed adjacent to the plurality of cells for waterproofing the acoustic transducer array. The step of providing a honeycomb structure comprises the step of including in the honeycomb structure a plurality of multi-sided cells. The step of providing a honeycomb structure comprises the step of including in the honeycomb structure a plurality of cylindrical cells. The step of providing the honeycomb structure comprises the step of providing a matrix of a plurality of strips attached together at cross-over points, the strips being made of an impact-resistant material. The step of providing a honeycomb structure having a plurality of cells comprises the step of providing at least one piezocomposite element having a 1-3 connectivity configuration in each of the cells. The step of providing a honeycomb structure having a plurality of cells comprises the step of providing at least one piezocomposite element having a 2-2 connectivity configuration in each of the cells.

Additional objects, features and advantages of the invention will become apparent to those skilled in the art upon consideration of the following detailed description of the preferred embodiments exemplifying the best mode of carrying out the invention as presently perceived.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DETAILED OF ILLUSTRATIVE EMBODIMENT

Figure 1:
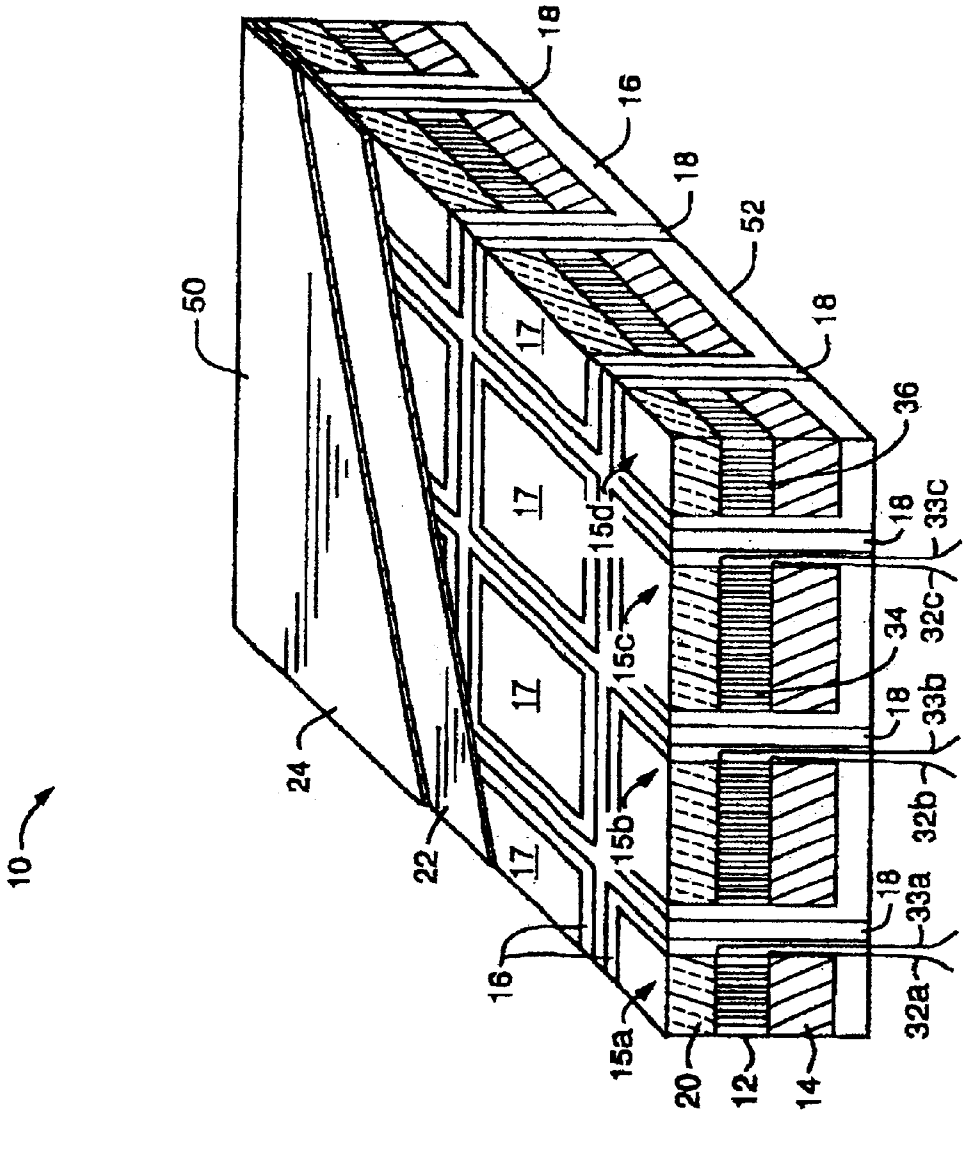
FIG. 1 is a partial sectional and perspective view of a preferred embodiment of an impact-reinforced honeycomb structure acoustic transducer array.

Referring to FIG. 1, a perspective view of an impact-reinforced, piezocomposite, acoustic transducer 10 is shown comprising an array of individual piezocomposite transducer elements 12, each placed in a single cell 17 of a honeycomb load supporting structure 18. In FIG. 1 the front 50 of the acoustic transducer 10 is shown as the upper side which is covered by a layer 24 of a fiber reinforced polymer, and the back 52 of the acoustic transducer 10 is considered the bottom side which is a soft matrix material 16.

Figure 2:
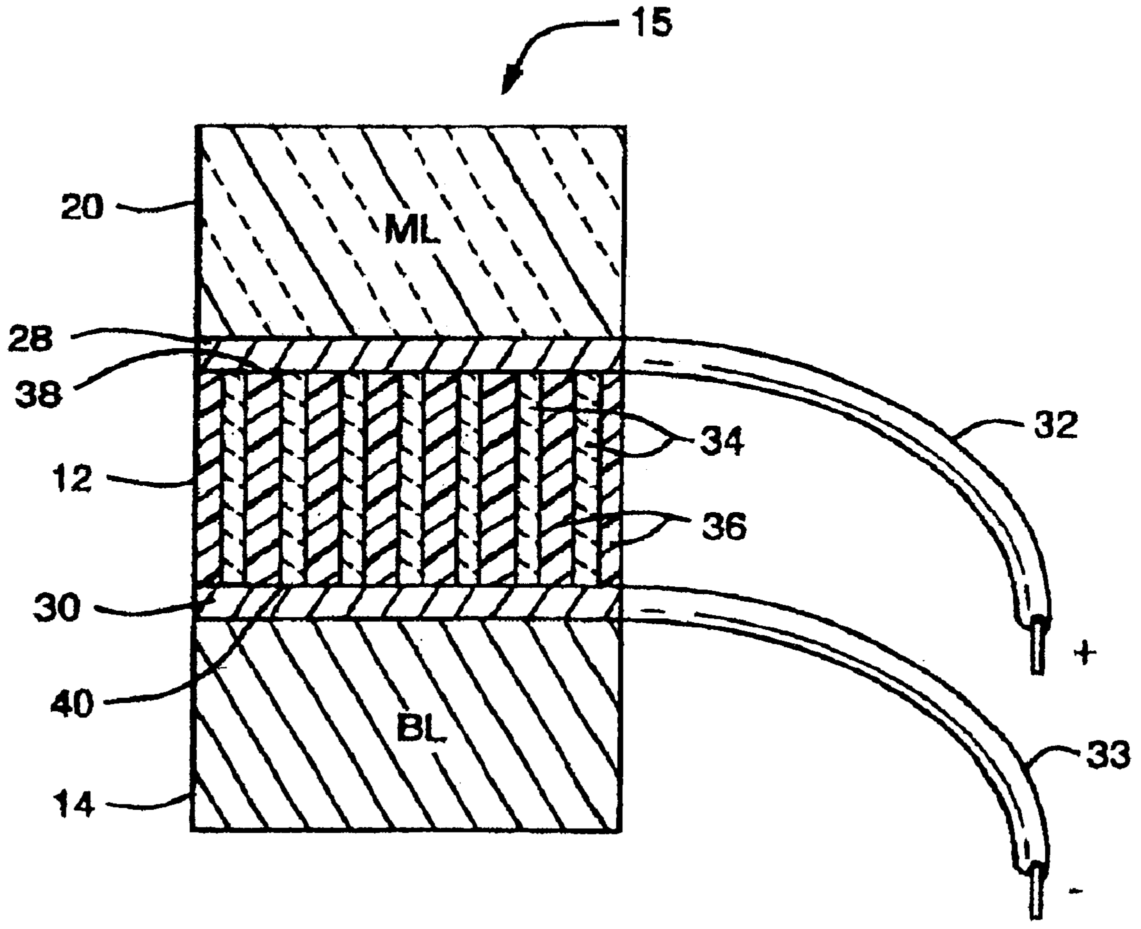
FIG. 2 is a cross-sectional view of a stack showing a piezocomposite element having a conductive electrode on an upper surface and a lower surface with a wire attached to each electrode and an acoustic matching layer above the piezocomposite element and a backing layer below the piezocomposite element.

Referring now to FIG. 1 and FIG. 2, FIG. 2 shows a cross-sectional view of a stack 15 which occupies each cell 17. Each piezocomposite element 12 includes a plurality of piezoceramic rods 34 arranged parallel to one another in a regular array. The rods 34 of each element 12 are encapsulated in a polymeric matrix 36 to form a 1-3 connectivity configured composite body, then the encapsulated composite body is abraded or machined to expose both ends of each ceramic element at opposite upper 38 and lower 40 planar surfaces of the piezocomposite element 12. As used herein, the term "1-3 piezocomposite" is intended to mean a composite of rods 34 or other shapes of a highly piezoelectric or electrostrictive ceramic material in a polymer matrix 36.

Referring to FIG. 2, a cross-sectional view of a stack 15 is shown comprising the piezocomposite element 12 with an acoustic impedance matching layer 20 adjacent to an upper conductive layer 28 of the 1-3 piezocomposite element and a stiffening layer adjacent to a lower conductive layer 30 of the 1-3 piezocomposite element 12. Upper and lower electrically conductive layers 28, 30, respectively, applied to the upper and lower planar surfaces 38, 40 of the piezocomposite element 12 serve as electrodes for the device. The conductive layers 28, 30 are applied to the piezocomposite element by depositing a conventional electrode material such as silver, gold, palladium, or an electrically conductive polymer, on the planar surface to establish electrical contact with the ceramic elements. To act as a transmitter, the wires 32, 33 attached to electrodes 28, 30 are connected to a source of electrical power by conventional means. To act as a receiver or sensor, the wires 32, 33 attached to the electrodes 28, 30 are connected to a means for detecting electrical pulses generated by the sensor in response to acoustic radiation striking the acoustic transducer 10. In FIG. 1, the wires 32, 33 which attach to each piezocomposite element 12 are only shown in stacks 15*a*, 15*b*, 15*c*, 15*d*.

This type of electroded piezocomposite transducer element 12 is described in U.S. Pat. No. 5,340,510, incorporated herein by reference. Also described in U.S. Pat. No. 5,340,510 is an alternate configuration for a piezocomposite element 12 including a multiplicity of parallel blades of piezoceramic material alternating in laminar fashion with layers of polymeric material to form a 2-2 connectivity configured or composite body.

Figure 5:
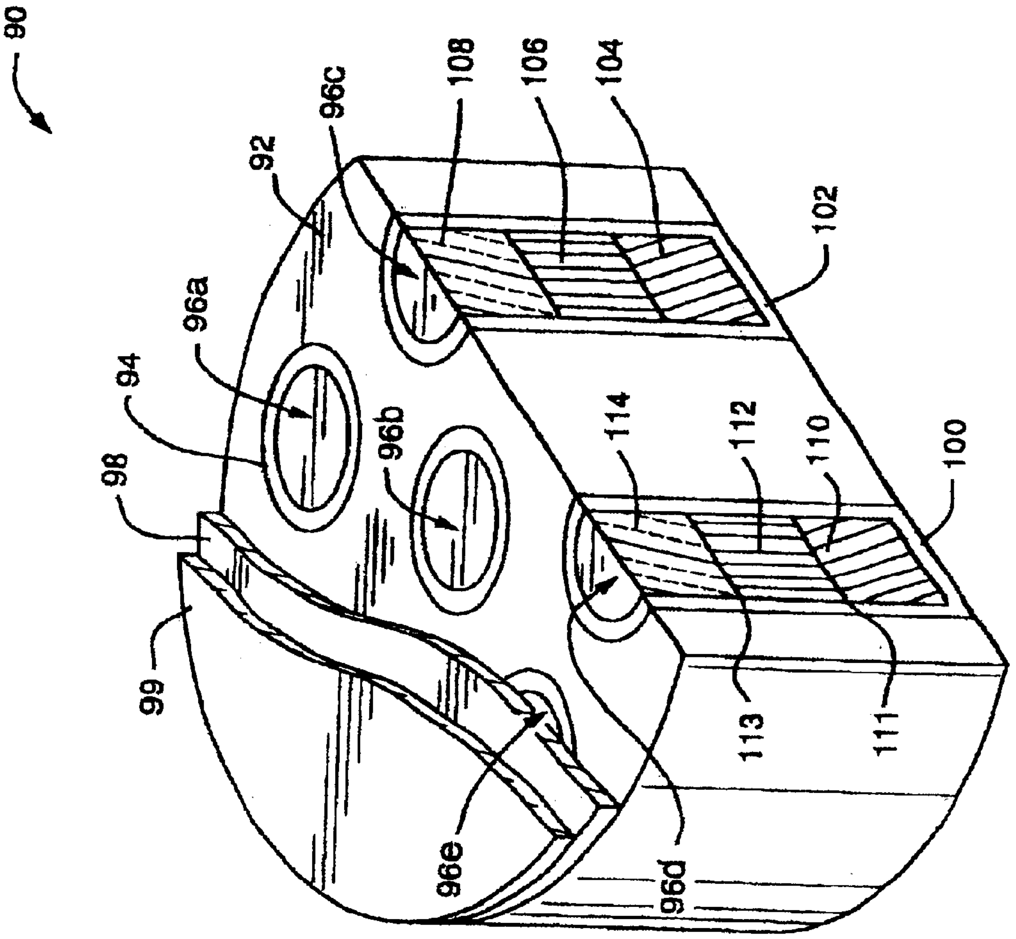
FIG. 5 is a partial sectional and perspective view of another preferred embodiment of an impact-reinforced piezocomposite transducer array having a honeycomb structure with a plurality of cylindrical cells.

Referring to FIG. 1 and FIG. 5, the piezocomposite elements 12 in the acoustic transducer 10 are each positioned in a stack 15 and the stack is placed within the cell 17 of a protecting and supporting "honeycomb" structure 18 of steel, titanium, fiber reinforced polymer or other impact-resistant material. A metal honeycomb structure 18 is preferred, particularly for underwater applications, and a steel or titanium structure is most preferred. As used herein, the term "honeycomb structure" is intended to mean a supporting structure including an array of cells exhibiting a hexagonal, square, rectangular, triangular, round, or other shape. The cells are of a size and shape selected to optimize the sensitivity and robustness of the device, as further described below. In FIG. 1, the honeycomb structure 18 is fabricated by welding together metal strips. In another embodiment as shown in FIG. 5, the honeycomb structure is fabricated by boring or otherwise forming round or other shaped holes in a metal plate. The piezocomposite elements 12 are acoustically decoupled from the honeycomb structure 18 and from the surface on which the transducer array is mounted by a layer of a very soft, e.g., voided, polymeric material 16.

Figure 3D:
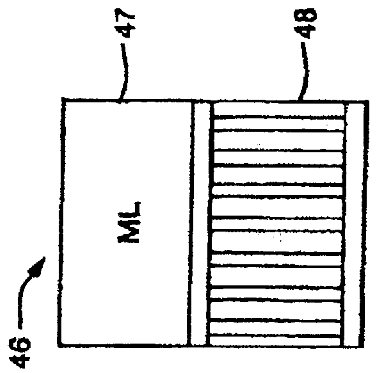
FIG. 3D shows a two layer stack comprising a piezocomposite element positioned below an acoustic matching layer.
Figure 3C:
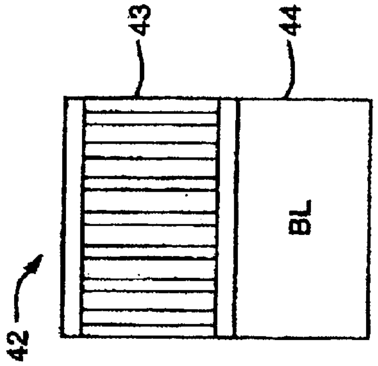
FIG. 3C shows a two layer stack comprising a base layer below a piezocomposite element.
Figure 3B:
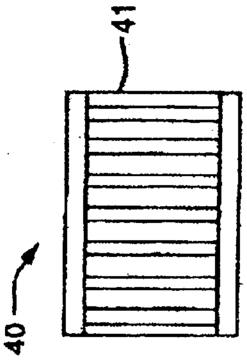
FIG. 3B shows a single layer stack comprising a piezocomposite element.
Figure 3A:
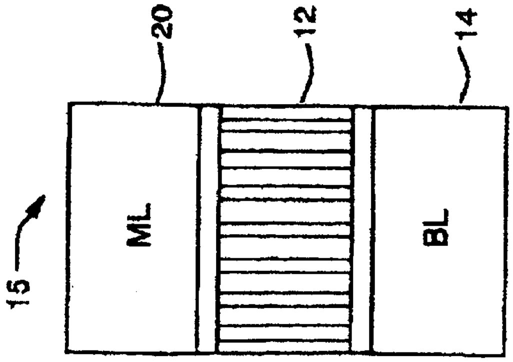
FIG. 3A shows a three layer stack comprising a backing layer, positioned below a piezocomposite element, and an acoustic matching layer positioned above the piezocomposite element.

Referring now to FIGS. 3A, 3B, 3C and 3D, various embodiments of the stack 15 are shown. FIG. 3A shows the embodiment of stack 15 as shown in FIG. 1 and described above. FIG. 3B shows a stack 40 comprising only the piezocomposite element 41 and without a matching layer 20 or a backing layer 14. FIG. 3C shows a stack 42 having a piezocomposite element 43 with a backing layer 44. FIG. 3D shows a stack 46 having a matching layer 47 positioned in front of the piezocomposite element 48. The characteristics of each stack is determined by the particular application of the acoustic transducer 10.

Figure 4B:
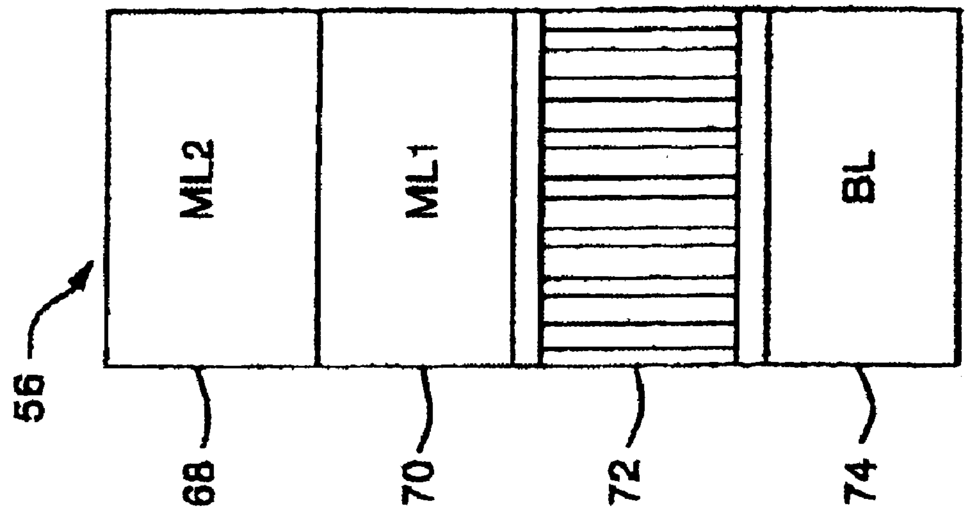
FIG. 4B shows a stack having double acoustic matching layers positioned above the piezocomposite element and a back layer below the piezocomposite element.
Figure 4A:
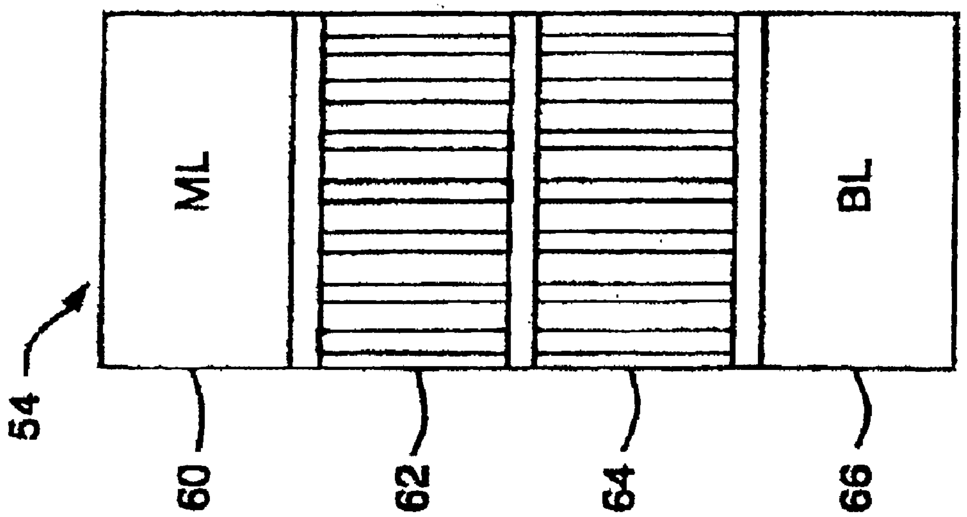
FIG. 4A shows a double piezocomposite element stack having an acoustic matching layer above and a backing layer below the piezocomposite element.

Referring to FIG. 4A and FIG. 4B, alternate embodiments are shown of stacks 54 and 56 having double elements or layers to achieve various frequencies of operation for the acoustic transducer. FIG. 4A shows a stack 54 having double piezocomposite elements 62, 64, an acoustic matching layer 60 above piezocomposite element 62 and a backing layer 66 below piezocomposite element 64. This stack 54 provides higher acoustic output for a given applied voltage than a single layer stack. Also, this stack has lower electrical impedance than an equivalent single layer stack, allowing better impedance matching to low impedance electrical circuits. Stack 54 can contain more than two layers of piezocomposite elements for further improved acoustic output and lower electrical impedance than the two layer stack 54.

FIG. 4B shows a stack 56 having double acoustic matching layers 68, 7D positioned above the piezocomposite element 72 and a backing layer 74. This stack 56 provides better acoustic impedance matching between the piezocomposite 72 and the device medium, e.g. water or air, than the equivalent single matching layer device of FIG. 3A. Also, the double matching layers 68, 70 allow broader bandwidth in operation, which improves the acoustic transducer 10 impulse response.

Referring again to FIG. 1 and FIG. 2, each cell 17 of the honeycomb structure 18 comprises a piezocomposite element 12 mounted on a rigid, e.g., steel base backing layer (BL) 14. This base layer 14 works with the acoustic impedance matching layer (ML) 20 disposed on an opposite side of the piezocomposite element 12, described below, to lower the resonant frequency of the device, e.g., for low frequency operation, and this combination forms the stack 15 within the cell 17. As shown in the FIG. 1, the decoupling layer 16 of soft polymer is disposed between the piezocomposite element 12 and the surface on which the device is mounted. In a preferred embodiment, the piezocomposite elements 12 are separately wired in a known manner for sensing or transmitting separately of one another. In another embodiment, some elements are wired to operate as sensors, while others may operate as transmitters.

The acoustic impedance matching layer 20 covers the upper or front side of each piezocomposite element 12. This matching layer 20 has a stiffness sufficient to protect the element with minimal acoustic affect. A preferred material for the matching layer 20 is a glass fiber reinforced polymer 20. More preferred are materials suitable to serve as an acoustic impedance matching layer for the element. Most preferred are materials having an acoustic impedance between that of the piezoceramic rods (or blades) 34 and that of the ambient medium, e.g., sea water, such as, between approximately MRayls and approximately 1.5 MRayls.

Also preferably, a thin layer 22 of steel, titanium, or other metal and/or an outer layer 24 of glass fiber reinforced polymer or other impact and abrasion resistant material cover the cells 12 with the piezocomposite elements 12 to provide long term waterproofing. Conveniently, a single sheet of each covers the entire device, protecting all of the cells 17 and the honeycomb structure 18.

The most preferred thickness of the thin metal layer 22 is below 1/20 of the desired operating wavelength. A thin metal layer 22 of this thickness does not significantly affect the response of the acoustic transducer 10. The thinner the covering layers 22, 24, the more acoustic vibration (load) is transferred to or from the piezoceramic rods (or blades) 34; however, thinner covering layers require smaller cells 17, which decreases the active (piezocomposite 12) to inactive (honeycomb structure 18 and decoupling layers) surface area ratio. Thus, in a preferred device, the thicknesses of these outer layers 22, 24 and the size of the cells 17 are each selected to optimize the robustness and sensitivity of the device. These parameters may be empirically determined. For example, when the honeycomb supported piezocomposite transducer 10 is mounted on the hull of a ship fitted as an icebreaker, the acoustic transducer 10 is wired conventionally as a sensor or transmitter. Ice or other debris striking the hull of the ship in the area of the transducer array 10 is deflected by the honeycomb structure, adding significant robustness to the array. This robustness enables the use, if desired, of a soft matrix material 16 around the piezocomposite portion of the device, greatly increasing the sensitivity, particularly the low frequency sensitivity, of the device. Thus, the transducer array 10 described herein combines low frequency sensitivity, robustness, and reasonable fabrication cost, and meets a long felt need.

Referring now to FIG. 5, a partial sectional and perspective view of another preferred embodiment of an impact-reinforced piezocomposite acoustic transducer 90 is shown having a plurality of cylindrical cells 94, each of the cells 94 comprising one of the stacks 96*a* to 96*e*. The structure of acoustic transducer 90 is embodied by metal such as steel, aluminum or titanium and comprises a plurality of cylindrical holes bored therein for receiving the stacks 96*a*–96*e* and very soft polymeric material 100 surrounding the cylindrical side and bottom of each of the stacks. Each stack 96*a*–96*e* comprises an acoustic matching layer 114 above a 1-3 piezocomposite element 112 with electrodes 111, 113 (wires are not shown which attach to the electrodes 111, 113), and a backing layer 110 below the 1-3 piezocomposite element 112. Alternate configurations of stacks 96*a*–96*e* may be used as shown in FIGS. 3A to 3D depending on the desired acoustic characteristics of 141, the acoustic transducer 90. For example, the frequency of resonance of the stack can be changed by increasing or decreasing the thickness and mass of the backing structure.

Still referring to FIG. 5, the acoustic transducer 90 is housed within a thin layer 98 of steel, titanium or other metal and an outer layer 99 of glass fiber reinforced polymer or other impact and abrasion resistant material to provide long term waterproofing for the cells 94.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed is:

1. An acoustic transducer array comprising:

a honeycomb structure having a plurality of cells, each of said cells comprises a piezoelectric transducer;

each piezoelectric transducer comprises a stack having at least one piezocomposite element;

each piezocomposite element includes a plurality of piezoceramic elements, said piezoceramic elements being arranged parallel to each other;

said plurality of piezoceramic elements of said piezocomposite element being encapsulated in a polymeric matrix forming said piezocomposite element;

a front planar surface and a back planar surface of said piezocomposite element comprise an electrically conductive layer; and a soft pressure release material is disposed around each stack except on a surface of said stack facing a front surface of said acoustic transducer array.

2. The acoustic transducer array as recited in claim 1 wherein said transducer array comprises means disposed adjacent to said plurality of cells for providing waterproofing of said acoustic transducer array.

3. The acoustic transducer array as recited in claim 1 wherein said honeycomb structure comprises a plurality of multi-sided cells.

4. The acoustic transducer array as recited in claim 1 wherein said honeycomb structure comprises a plurality of cylindrical cells.

5. The acoustic transducer array as recited in claim 1 wherein said honeycomb structure comprises a matrix of a plurality of strips attached together at cross-over points, said strips being made of an impact-resistant material.

6. The acoustic transducer as recited in claim 1 wherein said honeycomb structure comprises a molded or drilled-out structure made of an impact-resistant material.

7. The acoustic transducer array as recited in claim 1 wherein said piezocomposite element comprises a 1-3 connectivity configuration.

8. The acoustic transducer array as recited in claim 1 wherein said piezocomposite element comprises a 2-2 connectivity configuration.

9. The acoustic transducer array as recited in claim 1 wherein each piezocomposite element is separately wired for sensing as a single element.

10. The acoustic transducer array as recited in claim 1 wherein said piezocomposite element is wired for sensing in a phased array configuration.

11. The acoustic transducer array as recited in claim 1 wherein each piezocomposite element is separately wired for transmitting as a single element.

12. The acoustic transducer array as recited in claim 1 wherein each piezocomposite element is separately wired for transmitting in a phased array configuration.

13. The acoustic transducer array as recited in claim 1 wherein said stack comprises said piezocomposite element, an acoustic matching layer adjacent to a front surface of said piezocomposite element, and a stiffening layer adjacent to a back surface of said piezocomposite element.

14. The acoustic transducer array as recited in claim 1 wherein said stack comprises said piezocomposite element and a stiffening layer adjacent to a back surface of said piezocomposite element.

15. The acoustic transducer array as recited in claim 1 wherein said stack comprises said piezocomposite element and an acoustic matching layer adjacent to a front surface of said piezocomposite element.

16. The acoustic transducer array as recited in claim 1 wherein said stack comprises wires extending from said front planar surface electrically conductive layer and from said back planar surface electrically conductive layer of said piezocomposite element for wiring said cells in a predetermined manner for operation of said acoustic transducer as a sensor array.

17. The acoustic transducer array as recited in claim 1 wherein said stack comprises wires extending from said front planar surface electrically conductive layer and from said back planar surface electrically conductive layer of said piezocomposite element for wiring said cells in a predetermined manner for operation of said acoustic transducer as a transmitter array.

18. The acoustic transducer array as recited in claim 1 wherein said stack comprises a first piezocomposite element disposed adjacent to a second piezocomposite element, an acoustic matching layer adjacent to a front surface of said first piezocomposite element, and a stiffening layer adjacent to a back surface of said second piezocomposite element.

19. The acoustic transducer array as recited in claim 1 wherein said stack comprises a piezocomposite element, a first acoustic matching layer positioned adjacent to a front surface of said piezocomposite element, a second acoustic matching layer positioned adjacent to said first acoustic matching layer, and a stiffening layer adjacent to a back surface of said piezocomposite element.

20. A method of providing an acoustic transducer array for operation in a rugged environment comprising the steps of:

providing a honeycomb structure having a plurality of cells, each of said cells comprises a piezoelectric element;

providing in each piezoelectric transducer a stack having at least one piezocomposite element;

including a plurality of piezoceramic elements, in each piezocomposite element, said piezoceramic elements being arranged parallel to each other;

forming said piezocomposite element by encapsulating said plurality of piezoceramic elements of said piezocomposite element in a polymeric matrix;

providing an electrically conductive layer on a front planar surface and a back planar surface of said piezo-composite element; and disposing a soft pressure release material around each stack except on a surface of said stack facing a front surface of said acoustic transducer array.

21. The method as recited in claim 20 wherein said method comprises the step of providing means disposed adjacent to said plurality of cells for waterproofing said acoustic transducer array.

22. The method as recited in claim 20 wherein said step of providing a honeycomb structure comprises the step of said honeycomb structure having a plurality of multi-sided cells.

23. The method as recited in claim 20 wherein said step of providing a honeycomb structure comprises the step of said honeycomb structure having a plurality of cylindrical cells.

24. The method as recited in claim 20 wherein said step of providing a honeycomb structure comprises the step of providing a matrix of a plurality of strips attached together at cross-over points said strips being made of an impact-resistant material.

25. The method as recited in claim 20 wherein said step of providing a honeycomb structure having a plurality of cells comprises the step of providing at least one piezocomposite element having a 1-3 connectivity configuration in each of said cells.

26. The method as recited in claim 20 wherein said step of providing a honeycomb structure having a plurality of cells comprises the step of providing at least one piezocomposite element having a 2-2 connectivity configuration in each of said cells.

* * * * *